United States Patent
Lee et al.

(10) Patent No.: US 9,735,027 B2
(45) Date of Patent: Aug. 15, 2017

(54) METHOD FOR ETCHING ORGANIC FILM

(71) Applicant: TOKYO ELECTRON LIMITED, Tokyo (JP)

(72) Inventors: Chungjong Lee, Miyagi (JP); Takayuki Katsunuma, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/098,434

(22) Filed: Apr. 14, 2016

(65) Prior Publication Data
US 2016/0307775 A1  Oct. 20, 2016

(30) Foreign Application Priority Data
Apr. 20, 2015 (JP) ................................. 2015-085886

(51) Int. Cl.
*H01L 21/311* (2006.01)

(52) U.S. Cl.
CPC .. *H01L 21/31138* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 8,940,642 B2* | 1/2015 | Nemani | ............... | H01L 21/3105 438/710 |
| 9,330,973 B2* | 5/2016 | Watanabe | ......... | H01L 21/76897 |
| 2005/0016456 A1* | 1/2005 | Taguchi | ............... | H05H 1/2406 118/723 E |
| 2005/0208756 A1* | 9/2005 | Matsushita | ............. | G03F 7/427 438/622 |
| 2005/0215445 A1* | 9/2005 | Boumerzoug | ............ | B08B 5/02 510/175 |
| 2014/0197135 A1* | 7/2014 | Katsunuma | ....... | H01J 37/32477 216/67 |
| 2015/0064922 A1* | 3/2015 | Kitamura | .......... | H01L 21/31116 438/715 |
| 2015/0162203 A1* | 6/2015 | Kitamura | ............ | H01L 21/3065 438/710 |
| 2015/0270140 A1* | 9/2015 | Gupta | ............... | H01L 21/32136 216/67 |

(Continued)

FOREIGN PATENT DOCUMENTS

JP        2003-168676 A        6/2003

*Primary Examiner* — Allan Olsen
(74) *Attorney, Agent, or Firm* — Rothwell, Figg, Ernst & Manbeck, P.C.

(57) ABSTRACT

Disclosed is a method for etching an organic film. Plasma of a processing gas containing hydrogen gas and nitrogen gas is generated within a processing container of a plasma processing apparatus that accommodates a workpiece. A partial region of the organic film that is exposed from a hard mask is changed into a denatured region by the generation of the plasma of the processing gas. Subsequently, plasma of a rare gas is generated within the processing container. The denatured region is removed by the plasma of the rare gas, and a substance released from the denatured region is deposited on the surface of the hard mask. In this method, the generation of the plasma of the processing gas and the generation of the plasma of the rare gas are repeated alternately.

5 Claims, 11 Drawing Sheets

(56) References Cited

U.S. PATENT DOCUMENTS

| | | | |
|---|---|---|---|
| 2015/0325415 A1* | 11/2015 | Watanabe | H01J 37/32532 216/67 |
| 2016/0005651 A1* | 1/2016 | Watanabe | H01L 21/31116 438/702 |
| 2016/0155630 A1* | 6/2016 | Tsubota | H01L 21/67207 438/738 |
| 2016/0172231 A1* | 6/2016 | Lee | H01L 21/7682 438/643 |
| 2016/0372325 A1* | 12/2016 | Posseme | H01L 21/26533 |

* cited by examiner

METHOD FOR ETCHING ORGANIC FILM

CROSS-REFERENCE TO RELATED APPLICATIONS

This application is based on and claims priority from Japanese Patent Application No. 2015-085886, filed on Apr. 20, 2015, with the Japan Patent Office, the disclosure of which is incorporated herein in its entirety by reference.

TECHNICAL FIELD

Exemplary embodiments of the present disclosure relate to a method for etching an organic film.

BACKGROUND

In manufacturing an electronic device (e.g., a semiconductor device), plasma etching is used in order to transfer a pattern of a mask to a layer to be etched. For example, there is a case where a hard mask is obtained by transferring a pattern of a resist mask to a Si-containing anti-reflection film, and plasma etching is used to transfer the pattern of the hard mask to an organic film.

A plasma etching of an organic film is disclosed in, for example, Japanese Patent Laid-Open Publication No. 2003-168676. In the plasma etching disclosed in the publication, plasma of a processing gas containing hydrogen gas and nitrogen gas is generated within a processing container of a plasma processing apparatus so that the organic film is etched. Specifically, carbon forming the organic film turn into cyan molecules CN by a reaction with active species of nitrogen that are obtained from the nitrogen gas, and the cyan molecules turn into a highly volatile reaction product HCN by a reaction with active species of hydrogen. In the plasma etching disclosed in the publication, the reaction product is volatilized so that the organic film is etched while suppressing reattachment of the reaction product to a workpiece.

SUMMARY

An aspect of the present disclosure provides a method for etching an organic film of a workpiece. The workpiece includes a hard mask on an organic film. This method includes (a) generating plasma of a processing gas containing hydrogen gas and nitrogen gas within a processing container of a plasma processing apparatus that accommodates the workpiece, in which a partial region of the organic film that is exposed from the hard mask is changed into a denatured region, and (b) generating plasma of a rare gas within the processing container such that the denatured region is removed and a substance released from the denatured region is deposited on the surface of the hard mask. In this method, the generating the plasma of the processing gas and the generating the plasma of the rare gas are repeated alternately.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
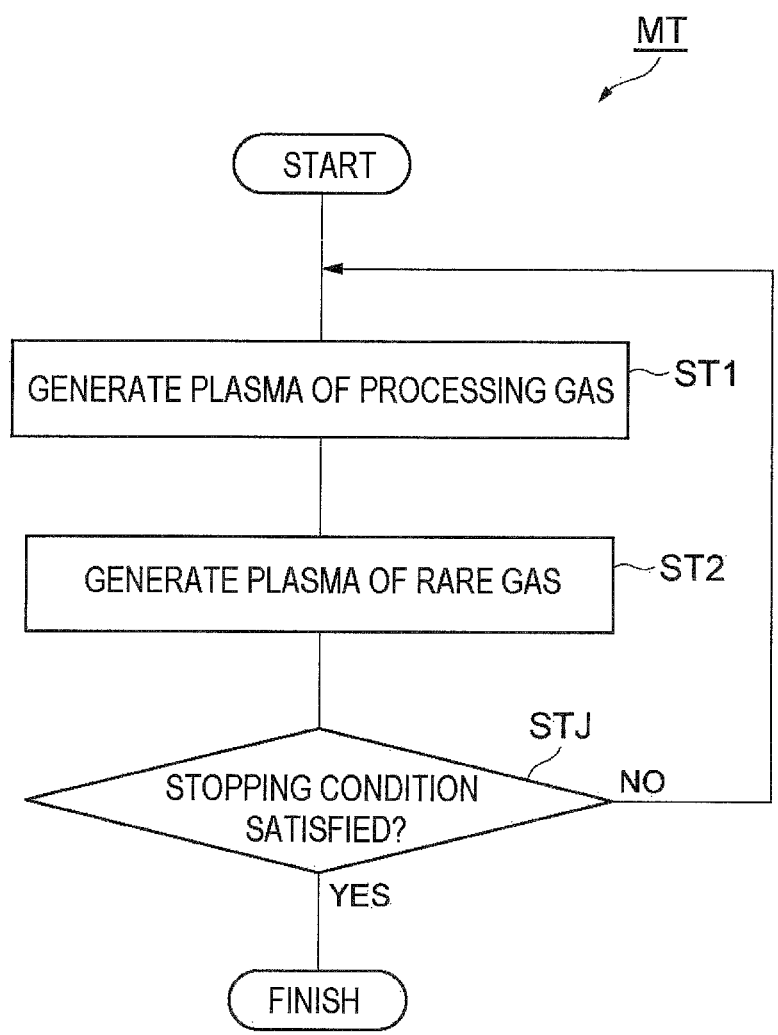
FIG. 1 is a flowchart illustrating a method for etching an organic film according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described plasma etching, the hard mask is shaved during the etching of the organic film. For example, the shoulder of the hard mask is shaved, and further, the film thickness of the hard mask is reduced. As a result, the shape of the hard mask is deteriorated, thereby lowering the transfer accuracy of a pattern to the organic film.

Thus, what is requested in the plasma etching of an organic film is to improve the shape of a hard mask.

An aspect of the present disclosure provides a method for etching an organic film. The workpiece includes a hard mask on an organic film. This method includes (a) generating a plasma of a processing gas containing hydrogen gas and nitrogen gas within a processing container of a plasma processing apparatus that accommodates the workpiece, in which a partial region of the organic film that is exposed from the hard mask is changed into a denatured region, and (b) generating a plasma of a rare gas within the processing container, in which the denatured region is removed, and a substance released from the denatured region is deposited on the surface of the hard mask. In this method, the generating the plasma of the processing gas and the generating the plasma of the rare gas are repeated alternately.

In the method according to the above-described aspect, the plasma of the processing gas is generated so that a partial region of the organic film is changed into a denatured region, and the denatured region is removed by active species supplied from the plasma of the rare gas. At this time, a substance released from the denatured region, i.e., a reaction product is deposited on the hard mask. When the plasma of the processing gas is generated next time, the reaction product is partially removed. The generation of the plasma of the processing gas and the generation of the plasma of the rare gas are repeated so that the organic film may be etched while improving the shape of the hard mask by the reaction product deposited on the surface of the hard mask.

In an exemplary embodiment, the workpiece is disposed on a placement table that includes a lower electrode within the processing container. In the step of generating the plasma of the rare gas, a power per unit area of a high frequency bias, which is supplied to the lower electrode, may be set to a power of 0.028 W/cm$^2$ or less. According to this exemplary embodiment, the damage to the hard mask due to the active species supplied from the plasma of the rare gas is further suppressed.

In an exemplary embodiment, no high frequency bias is supplied to the lower electrode in the step of generating the plasma of the processing gas. According to this exemplary embodiment, in the step of generating the plasma of the processing gas, the denatured region may be formed without substantially performing the etching of the organic film.

In an exemplary embodiment, a flow rate ratio of the hydrogen gas and the nitrogen gas, which is represented by a flow rate of the hydrogen gas in the processing gas to a flow rate of the nitrogen gas in a processing gas, may be set to be within a range of 1:3 to 9:1. When the hydrogen gas and the nitrogen gas are used at such a flow rate ratio, the etching of the organic film and the supply of the reaction product onto the hard mask are effectively performed.

In an exemplary embodiment, the method for etching an organic film may further include generating plasma of a hydrocarbon gas within the processing container. An amount of the reaction product deposited on the hard mask as described above increases in a region where the pattern of the hard mask is dense and decreases in a region where the pattern of the hard mask is coarse. On the other hand, an amount of hydrocarbon and/or carbon generated from the hydrocarbon gas and deposited on the hard mask decreases in the region where the pattern of the hard mask is dense and increases in the region where the pattern of the hard mask is coarse. Thus, according to this exemplary embodiment, when the hard mask includes the region where the hard mask having the coarse pattern is formed and the region where the hard mask having the dense pattern is formed, the difference in an amount of a deposit formed on the hard mask between the regions may be reduced.

As described above, in the plasma etching of the organic film, the shape of the hard mask may be improved.

Hereinafter, various exemplary embodiments will be described in detail with reference to the drawings. In addition, identical or corresponding parts in each of the drawings will be denoted by the same symbols.

Figure 2:
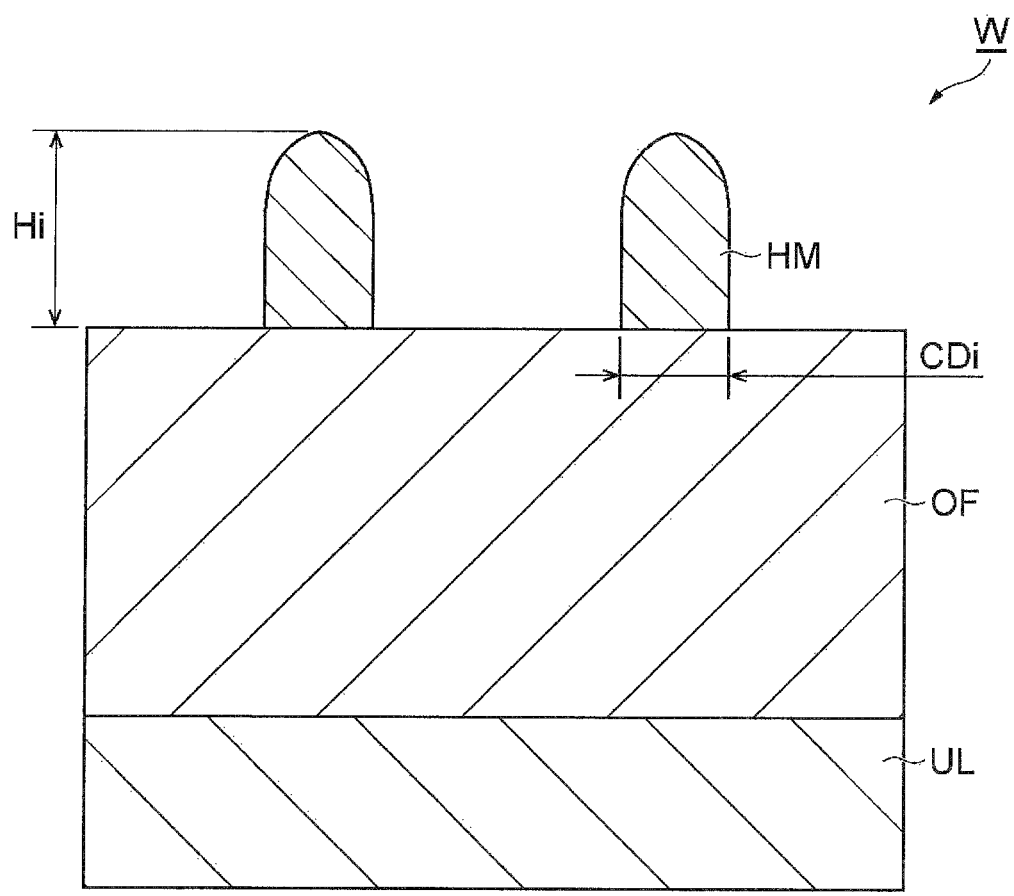
FIG. 2 is a cross-sectional view illustrating an exemplary workpiece.

FIG. 1 is a flowchart illustrating a method for etching an organic film according to an exemplary embodiment. The method MT illustrated in FIG. 1 is a method that etches an organic film in order to transfer a pattern of a hard mask to an organic film of a workpiece. FIG. 2 is a cross-sectional view illustrating an exemplary workpiece. The workpiece illustrated in FIG. 2 may have a shape of a wafer. Hereinafter, the workpiece to be processed in the method MT will be referred to as a "wafer W." As illustrated in FIG. 2, the wafer W includes an underlayer UL, an organic film OF, and a hard mask HM. The underlayer UL is, for example, but not limited to, a polycrystalline silicon layer or a silicon oxide layer.

The organic film OF is provided on the underlayer UL. The organic film OF contains carbon such as, for example, hydrocarbon. The hard mask HM is provided on the organic film OF. The hard mask HM is made of, for example, but not limited to, a Si-containing antireflection film. The hard mask HM has a pattern that provides an opening. The hard mask HM having such a pattern is formed by, for example, preparation of a resist mask through photolithography and plasma etching.

Figure 3:
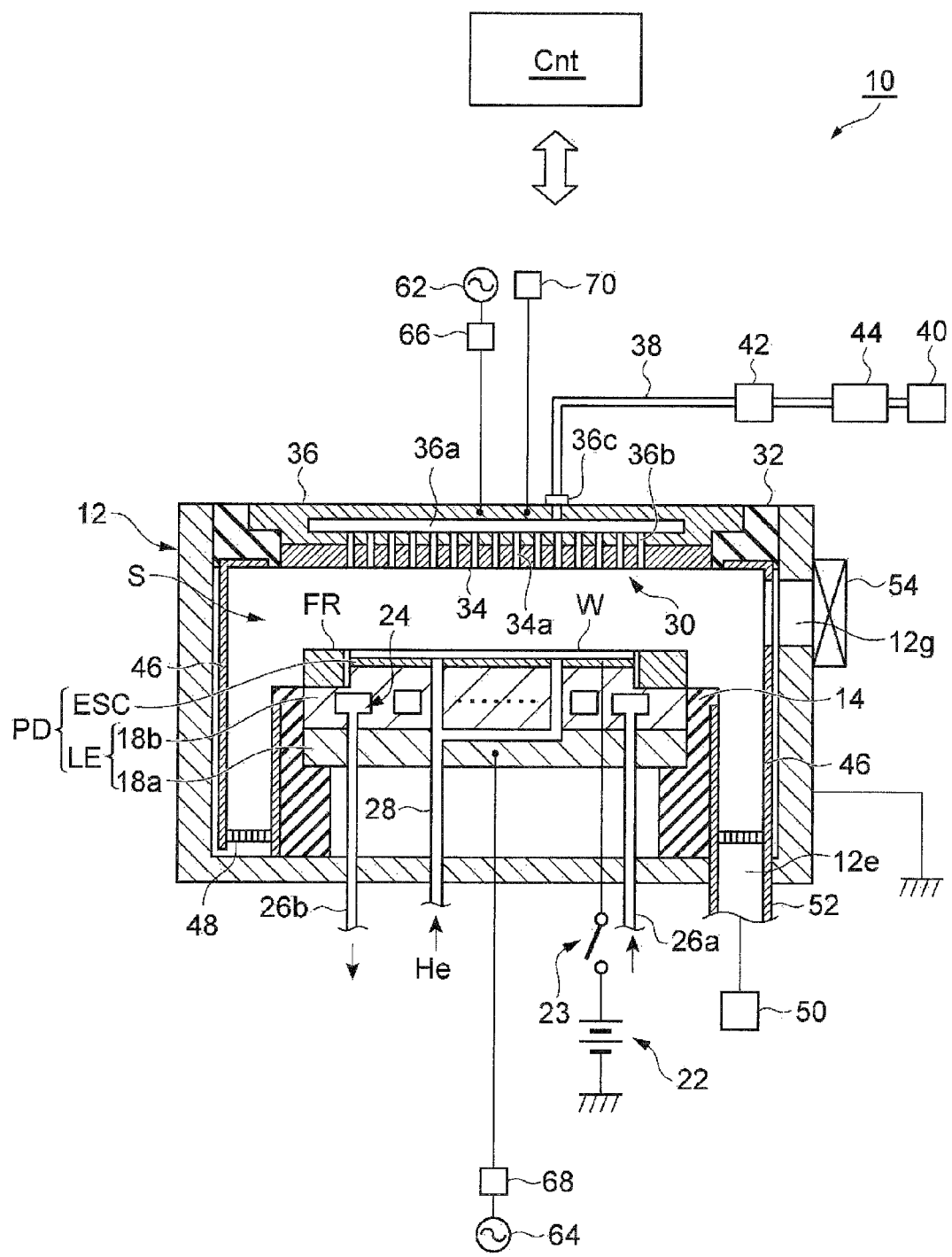
FIG. 3 is a view schematically illustrating an exemplary plasma processing apparatus which may be used for performing the method illustrated in FIG. 1.

In the method MT illustrated in FIG. 1, the wafer W is first carried into a processing container of a plasma processing apparatus. FIG. 3 is a view schematically illustrating an example of the plasma processing apparatus which may be used for the performance of the method illustrated in FIG. 1. The plasma processing apparatus 10 illustrated in FIG. 3 is a capacitively-coupled plasma etching apparatus and includes a substantially cylindrical processing container 12. An inner wall surface of the processing container 12 is made of, for example, anodized aluminum. The processing container 12 is frame-grounded.

On a bottom portion of the processing container 12, a substantially cylindrical support unit 14 is provided. The support unit 14 is made of, for example, an insulating material. The support unit 14 vertically extends from the bottom portion of the processing container 12 within the processing container 12. A placement table PD is provided within the processing container 12. The placement table PD is supported by the support unit 14.

The placement table PD holds the wafer W on the top surface thereof. The placement table PD includes a lower electrode LE and an electrostatic chuck ESC. The lower electrode LE includes a first plate 18a and a second plate 18b. Each of the first plate 18a and the second plate 18b is made of a metal such as, for example, aluminum, and has substantially a disk shape. The second plate 18b is provided on the first plate 18a, and is electrically connected to the first plate 18a.

The electrostatic chuck ESC is provided on the second plate 18b. The electrostatic chuck ESC has a structure where a film-type electrode is disposed between a pair of insulating layers or insulating sheets. A DC power supply 22 is electrically connected to the electrode of the electrostatic chuck ESC via a switch 23. The electrostatic chuck ESC attracts the wafer W by an electrostatic force such as a coulomb force generated by a DC voltage from the DC power supply 22. Accordingly, the electrostatic chuck ESC may hold the wafer W thereon.

On the periphery edge of the second plate 18b, a focus ring FR is disposed to surround the edge of the wafer W and the electrostatic chuck ESC. The focus ring FR is provided to improve the uniformity of the etching. The focus ring FR is formed of a material appropriately selected depending on a material of a film to be etched, and may be made of, for example, quartz.

A coolant flow path 24 is formed within the second plate 18b. The coolant flow path 24 constitutes a temperature control mechanism. A coolant is supplied to the coolant flow path 24 from a chiller unit provided outside the processing container 12 through a pipe 26a. The coolant supplied to the coolant flow path 24 is returned to the chiller unit through a pipe 26b. In this manner, between the coolant flow path 24 and the chiller unit, the coolant is circulated. By controlling the temperature of the coolant, the temperature of the wafer W supported by the electrostatic chuck ESC is controlled.

A gas supply line 28 is formed in the plasma processing apparatus 10. The gas supply line 28 supplies a heat transfer gas such as, for example, a He gas, from a heat transfer gas supply mechanism to a gap between the top surface of the electrostatic chuck ESC and the rear surface of the wafer W.

The plasma processing apparatus 10 includes an upper electrode 30. The upper electrode 30 is disposed to face the placement table PD above the placement table PD. The lower electrode LE and the upper electrode 30 are provided substantially parallel to each other. Between the upper electrode 30 and the lower electrode LE, a processing space S is provided to perform a plasma processing on the wafer W.

The upper electrode 30 is supported at the top portion of the processing container 12 through an insulating shielding member 32. In an exemplary embodiment, the upper electrode 30 may be configured such that a distance from the top surface of the placement table PD, that is, the wafer placing surface, in a vertical direction is variable. The upper electrode 30 may include an electrode plate 34 and an electrode support 36. The electrode plate 34 faces the processing space S, and a plurality of gas ejecting holes 34a are formed in the electrode plate 34. The electrode plate 34 is made of silicon in an exemplary embodiment.

The electrode support 36 is configured to detachably support the electrode plate 34 and may be made of, for example, a conductive material such as aluminum. The electrode support 36 may have a water-cooling structure. A gas diffusion chamber 36a is formed within the electrode support 36. A plurality of gas flow holes 36b extend downwards from the gas diffusion chamber 36a to communicate with the gas ejecting holes 34a. A gas inlet port 36c is formed in the electrode support 36 to guide a processing gas into the gas diffusion chamber 36a. A gas supply pipe 38 is connected to the gas inlet port 36c.

A gas source group 40 is connected to the gas supply pipe 38 through a valve group 42 and a flow rate controller group 44. The gas source group 40 includes a plurality of gas sources. As an example, the gas source group 40 includes a source of a hydrogen gas ($H_2$ gas), a source of a nitrogen gas ($N_2$ gas), a source of a rare gas, and a source of a hydrocarbon gas. As the rare gas, any rare gas such as, for example, a He gas, a Ne gas, an Ar gas, and a Kr gas may be used. The hydrocarbon gas is, for example, a $CH_4$ gas.

The valve group 42 includes a plurality of valves, and the flow rate controller group 44 includes a plurality of flow rate controllers such as, for example, a mass flow controller. The plurality of gas sources of the gas source group 40 are connected to the gas supply pipe 38 through respective corresponding valves of the valve group 42, and respective corresponding flow controllers of the flow rate controller group 44.

In the plasma processing apparatus 10, a deposition shield 46 is detachably provided along the inner wall of the processing container 12. The deposition shield 46 is also provided on the outer periphery of the support unit 14. The deposition shield 46 is configured to suppress etching by-products (deposits) from being attached to the processing container 12, and may be formed by coating a ceramic such as, for example, $Y_2O_3$ on an aluminum material.

An exhaust plate 48 is provided on the bottom side of the processing container 12 between the support unit 14 and the side wall of the processing container 12. The exhaust plate 48 may be formed by coating a ceramic such as, for example, $Y_2O_3$ on an aluminum material. An exhaust port 12e is formed below the exhaust plate 48 in the processing container 12. An exhaust device 50 is connected to the exhaust port 12e through an exhaust pipe 52. The exhaust device 50 includes a vacuum pump such as, for example, a turbo molecular pump and may decompress the space within the processing container 12 to a desired degree of vacuum. A carry-in/out port 12g of the wafer W is formed in the side wall of the processing container 12. The carry-in/out port 12g is configured to be capable of being opened/closed by a gate valve 54.

The plasma processing apparatus 10 further includes a first high frequency power supply 62 and a second high frequency power supply 64. The first high frequency power supply 62 is a power supply which generates a high frequency wave for generating plasma and generates a high frequency wave of a frequency of 27 MHz to 100 MHz, for example, a high frequency wave of 60 MHz. The first high frequency power supply 62 is connected to the lower electrode LE through a matching unit 66. The matching unit 66 includes a circuit configured to match an output impedance of the first high frequency power supply 62 to an input impedance of a load side (the upper electrode 30 side). The first high frequency power supply 62 may be connected to the lower electrode LE through the matching unit 66.

The second high frequency power supply 64 is a power supply which generates a high frequency bias for drawing ions into the wafer W, and generates a high frequency bias of a frequency ranging from, for example, 400 kHz to 13.56 MHz. The second high frequency power supply 64 is connected to the lower electrode LE through a matching unit 68. The matching unit 68 includes a circuit configured to match an output impedance of the second high frequency power supply 64 to an input impedance of a load side (the lower electrode LE side).

The plasma processing apparatus 10 further includes a power supply 70. The power supply 70 is connected to the upper electrode 30. The power supply 70 applies a voltage for drawing positive ions present within the processing space S to the electrode plate 34, to the upper electrode 30. In an example, the power supply 70 is a DC power supply for generating a negative DC voltage. In another example, the power supply 70 may be an AC power supply for generating an AC voltage of a relatively low frequency.

In an exemplary embodiment, the plasma processing apparatus 10 may further include a controller Cnt. The controller Cnt is a computer provided with, for example, a processor, a storage unit, an input device, and a display device, and controls each of the units of the plasma processing apparatus 10. The controller Cnt allows an operator to perform, for example, the input operation of a command through the input device in order to manage the plasma processing apparatus 10, and allows the display device to visually display the driving situation of the plasma processing apparatus 10. The storage unit of the controller Cnt stores a control program to cause a processor to control various processings performed in the plasma processing apparatus 10, or a program to cause each of the units of the plasma processing apparatus 10 to perform a processing according to a processing condition, i.e., a processing recipe. In an exemplary embodiment, the controller Cnt controls each of the units of the plasma processing apparatus 10 according to a processing recipe for the method MT or a method of another exemplary embodiment which will be described later.

Figure 4:
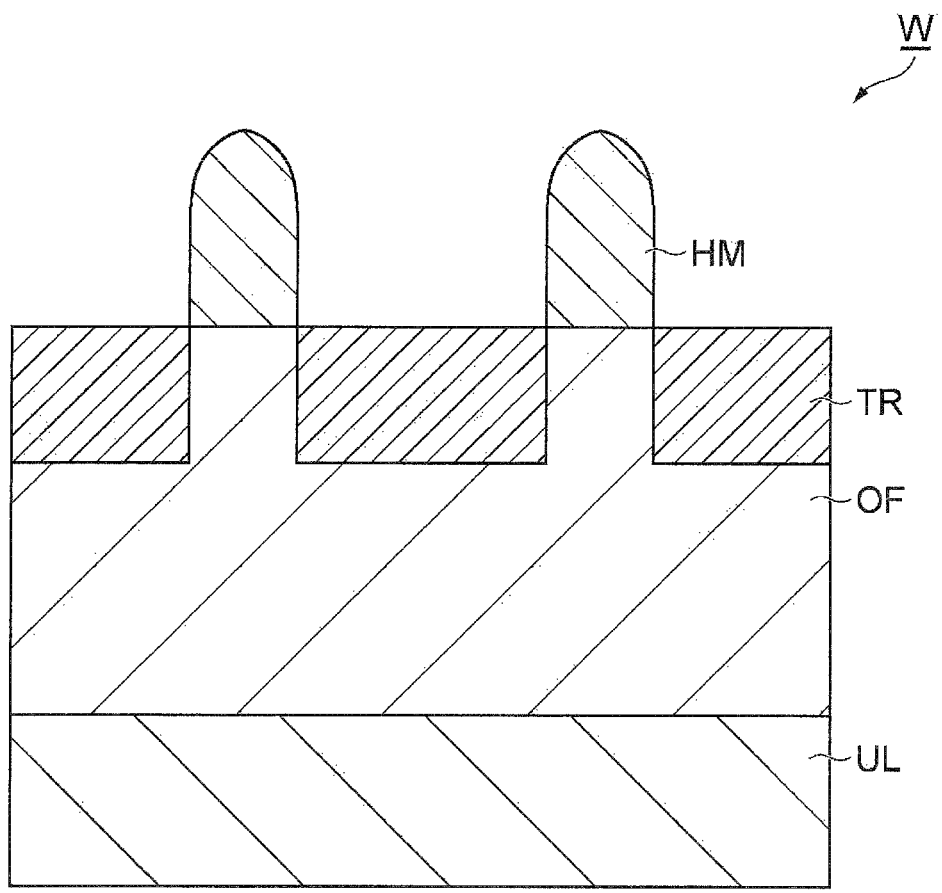
FIG. 4 is a cross-sectional view illustrating a state of the workpiece during the performance of the method illustrated in FIG. 1.
Figure 5:
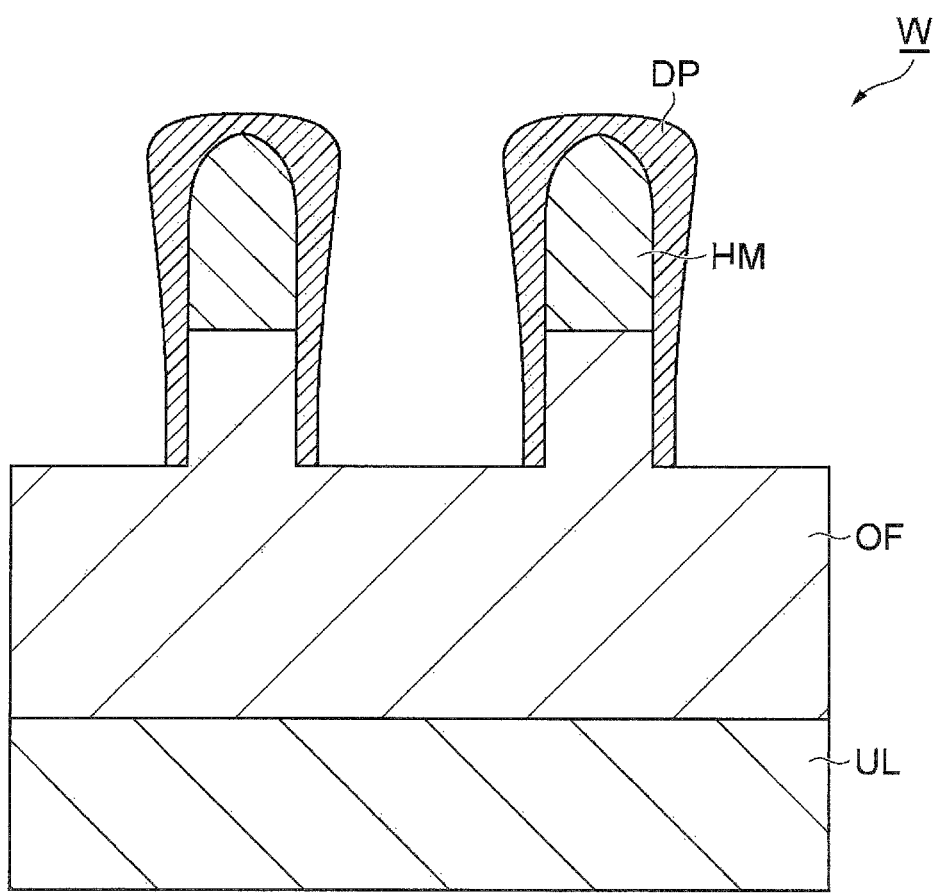
FIG. 5 is a cross-sectional view illustrating a state of the workpiece during the performance of the method illustrated in FIG. 1.
Figure 6:
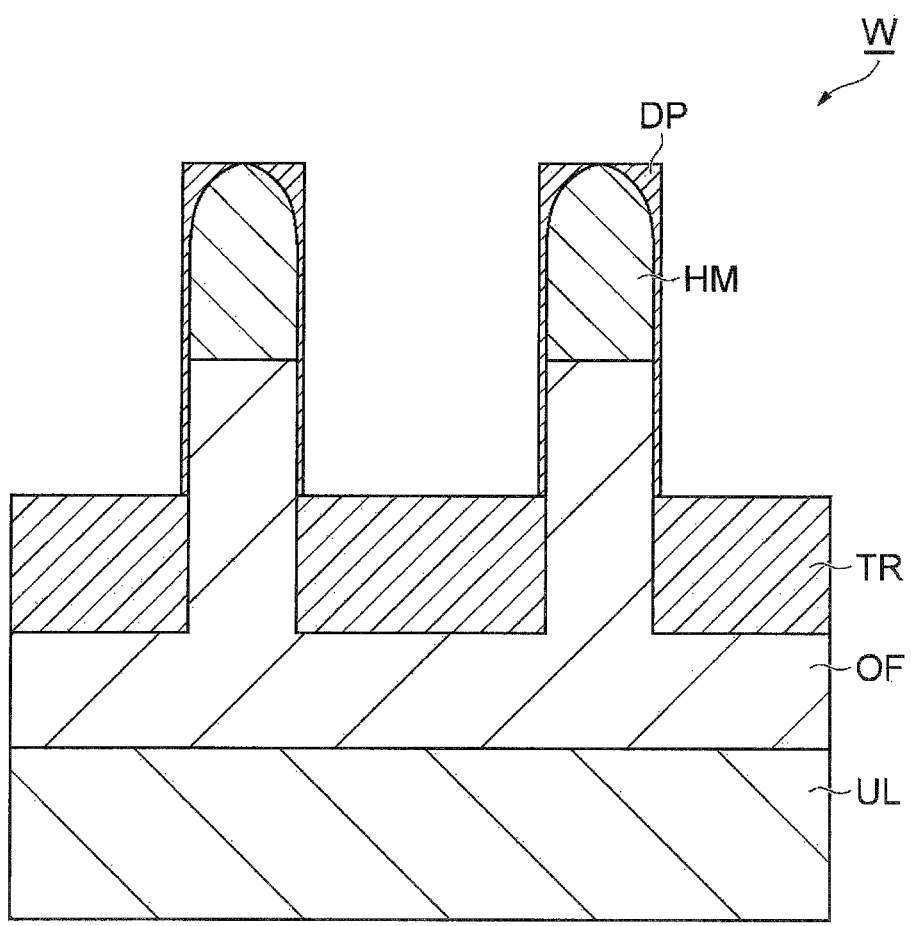
FIG. 6 is a cross-sectional view illustrating a state of the workpiece during the performance of the method illustrated in FIG. 1.
Figure 7:
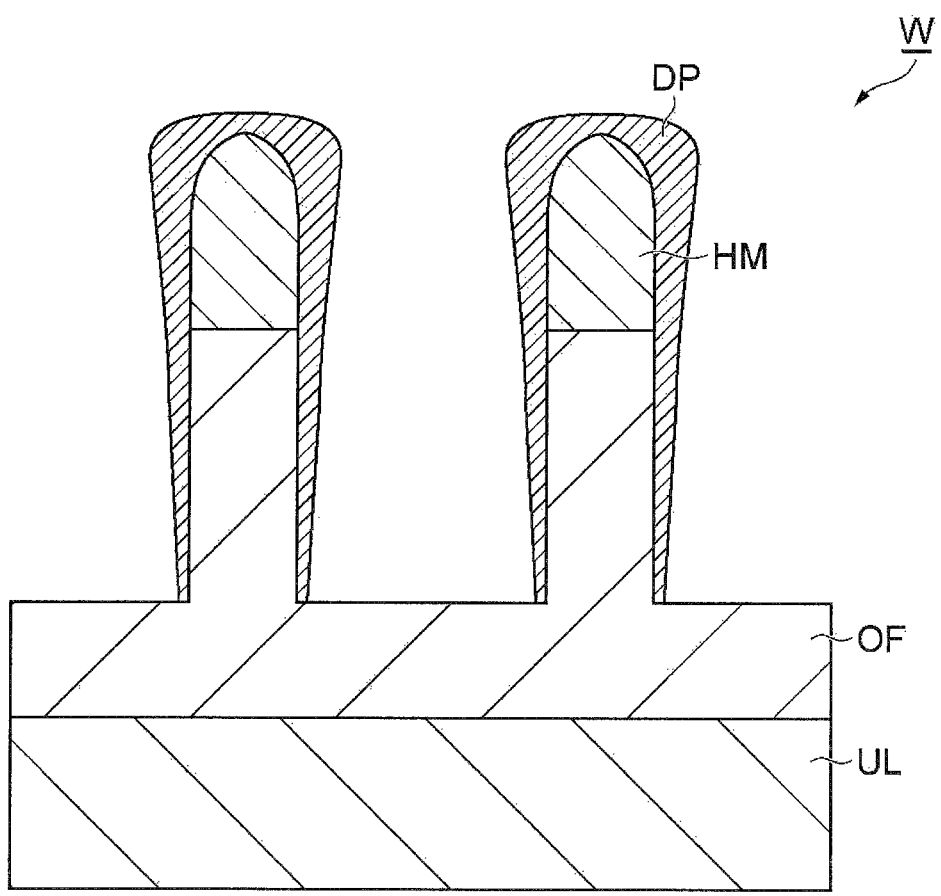
FIG. 7 is a cross-sectional view illustrating a state of the workpiece during the performance of the method illustrated in FIG. 1.
Figure 8:
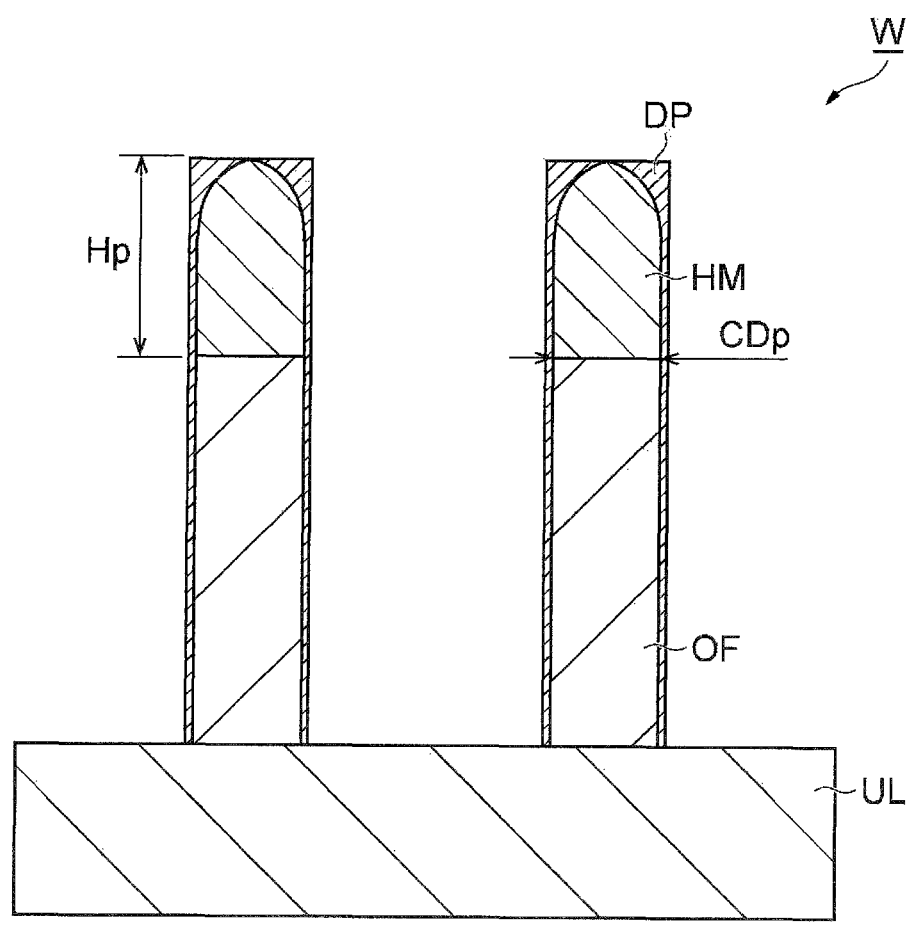
FIG. 8 is a cross-sectional view illustrating a state of the workpiece after the performance of the method illustrated in FIG. 1.

Returning back to FIG. 1, the method MT will be described. In the following descriptions, FIGS. 4 to 8 will be referred to, in addition to FIG. 1. FIGS. 4 to 8 are cross-sectional views each illustrating a state of a workpiece during or after the performance of the method illustrated in FIG. 1. FIG. 4 illustrates a state of the workpiece after the first performance of step ST1. FIG. 5 illustrates a state of the workpiece after the first performance of step ST2. FIG. 6 illustrates a state of the workpiece after the performance of step ST1 subsequent to the first performance thereof. FIG. 7 illustrates a state of the workpiece after the performance of step ST2 subsequent to the first performance thereof. FIG. 8 illustrates a state of the workpiece after the termination of the method MT. Hereinafter, descriptions will be made on an example where the method MT is performed by using the plasma processing apparatus 10.

As described above, in the method MT, the wafer W is carried into the processing container of the plasma processing apparatus 10. The wafer W is placed on the electrostatic chuck ESC and held by the electrostatic chuck ESC.

In the method MT, step ST1 and step ST2 are repeated alternately. In step ST1, the plasma of the processing gas is generated within the processing container 12. This processing gas contains hydrogen gas and nitrogen gas. In an exemplary embodiment, a flow rate ratio, which is represented by the flow rate of the hydrogen gas in the processing gas to the flow rate of the nitrogen gas in the processing gas, is set to be within a range of 1:3 to 9:1.

In step ST1, the processing gas is supplied into the processing container 12. The exhaust device 50 is operated so as to set the pressure within the processing container 12 to a predetermined pressure. High frequency waves from the first high frequency power supply 62 are supplied to the upper electrode 30. In step ST1 of the present exemplary embodiment, the high frequency bias from the second high frequency power supply 64 is not supplied to the lower electrode LE. That is, step ST1 may be performed in a no-bias state.

In step ST1, active species from the plasma generated within the processing container 12 (e.g., hydrogen radicals and nitrogen radicals) are supplied to a region of the organic film OF, which is exposed from the hard mask HM, among the whole regions of the organic film OF. The supplied active species react with the carbon of the organic film OF so that a denatured region TR is formed as illustrated in FIG. 4.

In subsequent step ST2, the plasma of the rare gas is generated within the processing container 12. The rare gas is, for example, Ar gas, but any rare gas may be used. In step ST2, the rare gas is supplied into the processing container 12. The exhaust device 50 is operated so as to set the pressure within the processing container 12 to a predetermined pressure. The high frequency waves from the first high frequency power supply 62 are supplied to the upper electrode 30. The high frequency bias from the second high frequency power supply 64 is supplied to the lower electrode LE. In step ST2 of the present exemplary embodiment, the power of the high frequency bias per unit area of the wafer W is set to a power of 0.028 $W/cm^2$ or less.

In step ST2, ions from the plasma of the rare gas generated within the processing container 12 are drawn into the wafer W. The ions drawn into the wafer W collide with the denatured region TR. As a result, a substance constituting the denatured region TR is released from the wafer W. Accordingly, the denatured region TR is removed as illustrated in FIG. 5. The substance released from the denatured region TR, i.e., a reaction product is attached to the surface of the hard mask HM so as to form a deposit DP thereon. The reaction product is also attached to the side wall surface of the organic film OF formed by etching.

In the method MT, it is determined, in subsequent step STJ, whether a stopping condition is satisfied. It is determined that the stopping condition is satisfied when the number of repetition times of the sequence including step ST1 and step ST2 reaches a predetermined number of times. When it is determined in step STJ that the stopping condition is not satisfied, step ST1 is performed again.

In the second performance and subsequent performance of step ST1, the plasma of the processing gas is also generated as in first step ST1. In the second performance and subsequent performance of step ST1, the region exposed from the hard mask HM in the whole region of the organic film OF is also changed into the denatured region TR. Further, in the second performance and subsequent performance of step ST1, the deposit DP is partially removed by the active species generated within the processing container 12. As a result, the shape of the hard mask HM is improved by the left deposit DP as illustrated in FIG. 6. In the subsequent performance of step ST2, the plasma of the rare gas is also generated as in first step ST2. As a result, the denatured region TR is removed. The reaction product constituting the denatured region TR is deposited on the surface of the hard mask HM so as to form a deposit DP thereon.

The sequence including step ST1 and step ST2 is repeated and the method MT is terminated when it is determined, in step STJ, that the stopping condition is satisfied. When the method MT is terminated, the wafer W becomes in a state where the organic film OF is etched until the underlayer UL is exposed, as illustrated in FIG. 8.

According to the method MT, the organic film OF may be etched while the shape of the hard mask HM is improved by the deposit DP as described above. Further, since the hard mask HM is protected by the deposit DP, the damage to the hard mask HM, i.e., the film thickness reduction, in the etching of the organic film OF may be suppressed.

In step ST1 of the present exemplary embodiment, no high frequency bias is supplied to the lower electrode LE as described above. According to this exemplary embodiment, the denatured region TR may be formed in step ST1 without substantially performing the etching of the organic film OF.

In step ST1 of the present exemplary embodiment, the flow rate ratio, which is represented by the flow rate of the hydrogen gas in the processing gas to the flow rate of the nitrogen gas in the processing gas, may be set to be within a range of 1:3 to 9:1, as described above. When the hydrogen gas and the nitrogen gas are used at such a flow rate ratio, the etching of the organic film OF and the supply of the reaction product onto the hard mask HM are effectively performed.

In the present exemplary embodiment, the power of the high frequency bias, which is supplied to the lower electrode LE, per unit area of the wafer W may be set to a power of 0.028 $W/cm^2$ or less, as described above. According to this exemplary embodiment, the damage to the hard mask HM due to the active species from the plasma of the rare gas is further suppressed.

Figure 9:
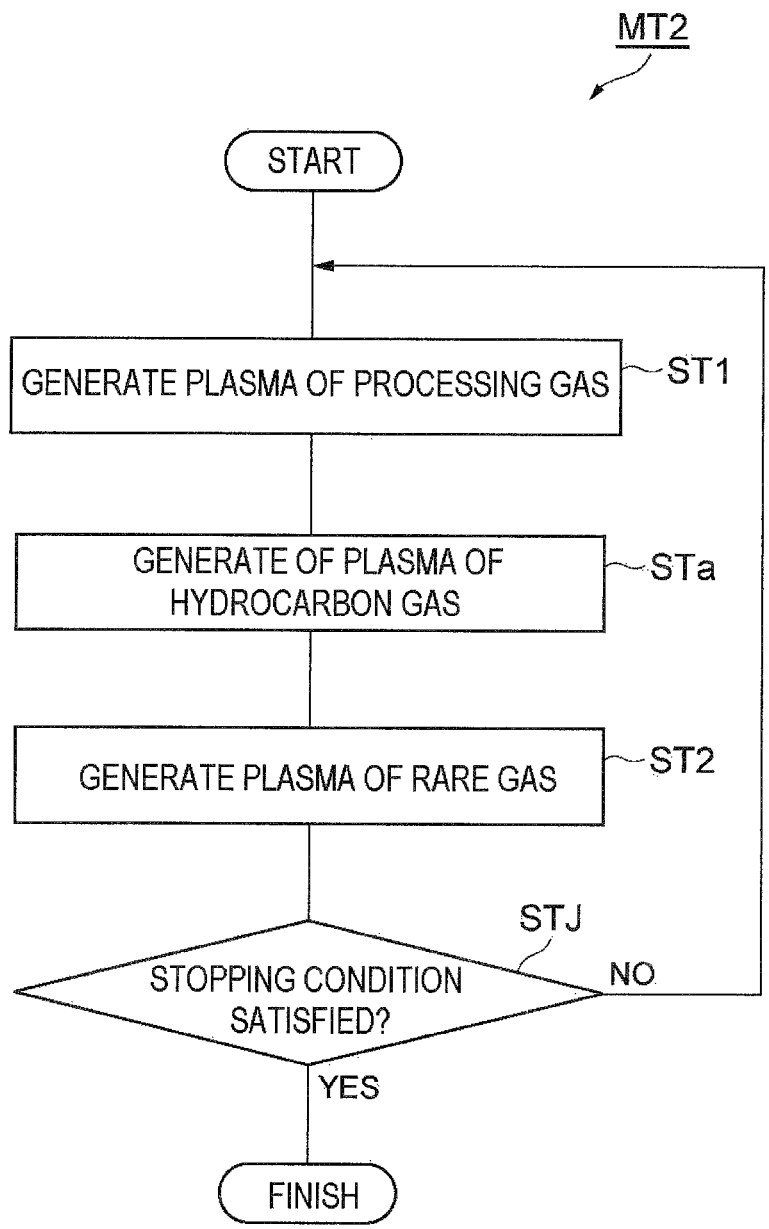
FIG. 9 is a flowchart illustrating a method for etching an organic film according to another exemplary embodiment.

Hereinafter, descriptions will be made on a method for etching an organic film OF according to another exemplary embodiment. FIG. 9 is a flow chart illustrating a method for etching an organic film according to another exemplary embodiment. The method MT2 illustrated in FIG. 9 is different from the method MT in that the sequence including step ST1 and step ST2 further includes step STa. In step STa, the plasma of the hydrocarbon gas is generated within the processing container 12.

In step STa, the hydrocarbon gas is supplied into the processing container 12. The hydrocarbon gas is, for example, $CH_4$ gas. The hydrocarbon gas may be diluted with a rare gas. In step STa, the exhaust device 50 is operated so as to set the pressure within the processing container 12 to a predetermined pressure. The high frequency waves from the first high frequency power supply 62 are supplied to the upper electrode 30. In step STa of the present exemplary embodiment, the high frequency bias from the second high frequency power supply 64 is not supplied to the lower electrode LE. That is, step STa may be performed in a no-bias state. According to step STa, in addition to the reaction product from the denatured region TR as described above, hydrocarbon and/or carbon from the hydrocarbon gas are deposited on the surface of the wafer W so as to form a deposit DP thereon.

Figure 10:
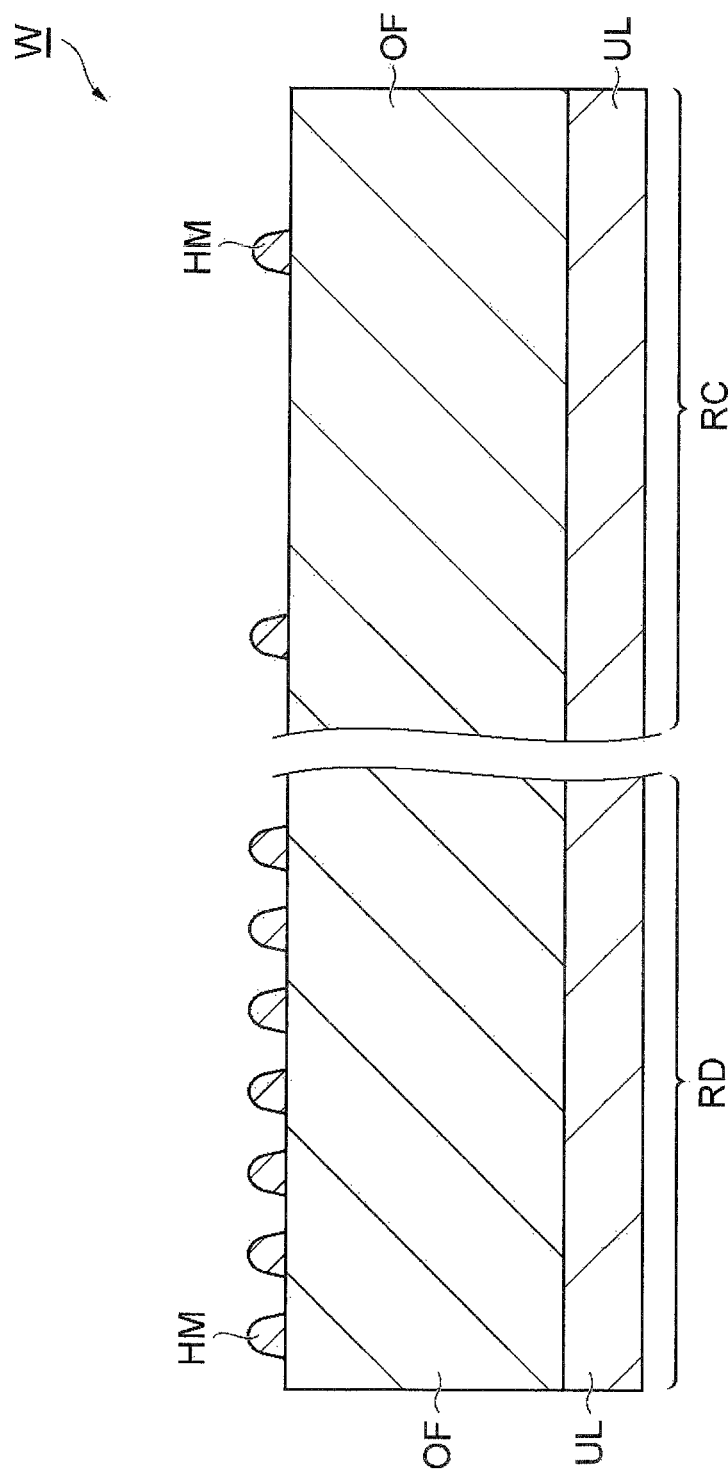
FIG. 10 is a cross-sectional view illustrating an exemplary workpiece.

Here, FIG. 10 will be referred to. FIG. 10 is a cross-sectional view illustrating an exemplary workpiece. The wafer W illustrated in FIG. 10 includes an underlayer UL, an organic film OF, and a hard mask HM, like the wafer W illustrated in FIG. 2. Further, the wafer W illustrated in FIG. 10 includes a dense region RD and a coarse region RC. The densities of the patterns of the hard masks HM in these regions are different from each other. Specifically, the pattern of the hard mask HM is more densely formed in the dense region RD than the pattern of the hard mask HM in the coarse region RC.

The amount of the reaction product deposited on the hard mask HM as described above increases in the dense region RD and decreases in the coarse region RC. On the other hand, the amount of the hydrocarbon and/or carbon, which are generated from the hydrocarbon gas and deposited on the hard mask HM, decreases in the dense region RD and increases in the coarse region RC. Accordingly, in the method MT2, the difference between the amount of the reaction product deposited on the hard mask HM of the dense region RD and the amount of the reaction product deposited on the hard mask HM of the coarse region RC may be reduced by the amount of the hydrocarbon and/or carbon generated from the hydrocarbon gas. Thus, according to the method MT2, the in-plane uniformity of the etching of the organic film OF in the wafer W including the dense region RD and the coarse region RC may be improved.

Hereinafter, descriptions will be made on experiments conducted for evaluation.

In Experimental Example 1, an organic film was etched by using the plasma processing apparatus 10 while variously setting the flow rate ratio of hydrogen gas and nitrogen gas. Below is the condition of Experimental Example 1.

Figure 11:
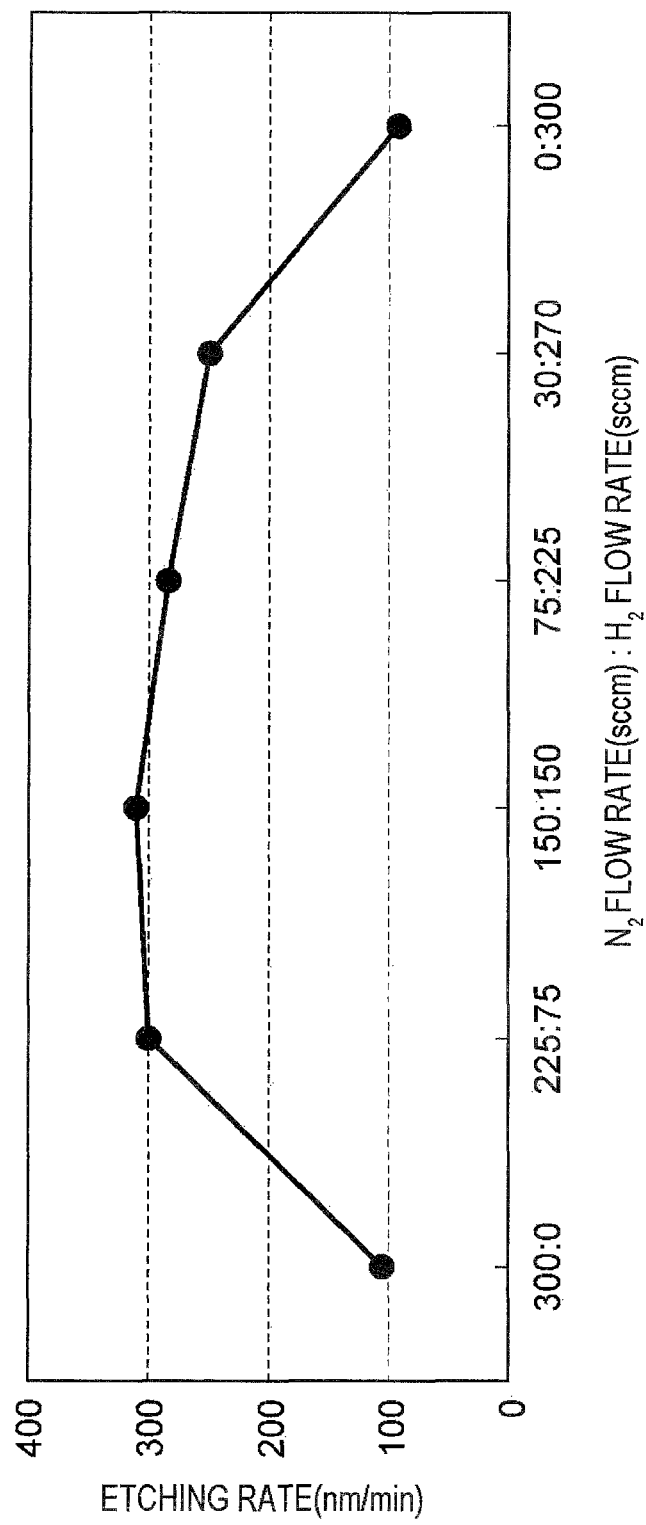
FIG. 11 is a graph illustrating an etching rate of the organic film.

<Condition>
Pressure within processing container 12: 100 mTorr (13.33 Pa)
Power of high frequency wave of first high frequency power supply 62: 1500 W
Power of high frequency bias of second high frequency power supply 64: 1200 W In Experimental Example 1, an etching rate of the organic film at each of the set flow rate ratios was calculated. FIG. 11 provides the results. In FIG. 11, the horizontal axis indicates a flow rate ratio of the nitrogen gas and the hydrogen gas (i.e., the ratio of the flow rate of the nitrogen (sccm) to the flow rate the hydrogen gas (sccm)), and the vertical axis indicates the etching rate. As illustrated in FIG. 11, it was confirmed that the etching rate of the organic film increases when the ratio of the flow rate of the nitrogen gas to the flow rate of the hydrogen gas is within the range of 225:75 to 30:270, i.e., 3:1 to 1:9. Especially, it was confirmed that the etching rate of the organic film increases when the flow rate of the hydrogen gas is 50% or less of the flow rate of the nitrogen gas. From the experiment results, it is estimated that the denatured region TR may be effectively formed by setting the ratio, which is represented by the flow rate of the nitrogen gas to the flow rate of the hydrogen gas in step ST1, to be within the range of 3:1 to 1:9 so that the reaction product may be effectively supplied to the hard mask HM in subsequent step ST2.

In Experimental Example 2, the organic film of the wafer illustrated in FIG. 2 was etched by performing the method MT with the plasma processing apparatus 10 while variously setting the power of the high frequency bias in step ST2. Below is the condition of Experimental Example 2. When the power of the high frequency bias of step ST2 is 10 W, the sequence including step ST1 and step ST2 having the condition described below was performed 112 times. When the power of the high frequency bias of step ST2 is 20 W, the sequence including step ST1 and step ST2 having the condition described below was performed 74 times. When the power of the high frequency bias of step ST2 is 50 W, the sequence including step ST1 and step ST2 having the condition described below was performed 57 times.

<Condition>
Pressure within processing container 12 of step ST1: 50 mTorr (6.666 Pa)
Flow rate of hydrogen gas of step ST1: 100 sccm
Flow rate of nitrogen gas of step ST1: 200 sccm
Power of high frequency wave of first high frequency power supply 62 in step ST1: 200 W
Power of high frequency bias of second high frequency power supply 62 in step ST1: 0 W
Performance time of step ST1: 12 seconds
Pressure within processing container 12 of step ST2: 50 mTorr (6.666 Pa)
Flow rate of Ar gas of step ST2: 300 sccm
Power of high frequency wave of first high frequency power supply 62 in step ST2: 100 W
Performance time of step ST2: 6 seconds The film thickness of the hard mask HM of the wafer in an initial state (see, e.g., FIG. 2), the width of the bottom portion of the hard mask HM of the wafer in the initial state (see, e.g., FIG. 2), the film thickness Hp of the hard mask HM after the etching of the organic film (see, e.g., FIG. 8), and the width CDp of the bottom portion of the hard mask HM after the etching of the organic film (see, e.g., FIG. 8) were calculated. Further, for the width CDp after the etching of the organic film, the width of the composite of the hard mask HM and the deposit DP was calculated as illustrated in FIG. 8. As a result, when the power of the high frequency bias of step ST2 was 50 W, the difference between the film thickness Hi and the film thickness Hp was 11.0 nm, and the difference between the width CDi and the width CDp was 4.3 mm. Thus, it was confirmed that when the power of the high frequency bias of step ST2 is 50 W, the damage to the hard mask HM becomes relatively large. On the other hand, when the power of the high frequency bias of step ST2 is 20 W and 10 W, the difference between the film thickness Hi and the film thickness Hp was 0.5 nm or less, and the difference between the width CDi and the width CDp was 1.3 nm or less. Thus, it was confirmed that when the power of the high frequency bias of step ST2 is 20 W or less, i.e., 0.028 W/cm$^2$, the damage to the hard mask HM is greatly suppressed.

The various exemplary embodiments of the present disclosure have been described, but various modifications may be made to the present disclosure without being limited to the above-described exemplary embodiments. For example, the above-described plasma processing apparatus 10 is a capacitively-coupled plasma processing apparatus, but an arbitrary plasma processing apparatus such as, for example, an inductively-coupled plasma processing apparatus or a plasma processing apparatus using surface waves (e.g., microwaves) may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for etching an organic film of an object to be processed ("workpiece") which includes a hard mask on the organic film, the method comprising:
generating plasma of a processing gas containing a hydrogen gas and a nitrogen gas within a processing container of a plasma processing apparatus that accommodates the workpiece, wherein a partial region of the organic film that is exposed from the hard mask is changed into a denatured region;
generating plasma of a rare gas within the processing container, wherein the denatured region is removed and a substance released from the denatured region is deposited on a surface of the hard mask; and
alternately repeating the generating the plasma of the processing gas and the generating the plasma of the rare gas.

2. The method of claim 1, wherein the workpiece is placed on a placement table that includes a lower electrode, within the processing container, and in the generating the plasma of the rare gas, a power of a high frequency bias, which is supplied to the lower electrode, per unit area is set to a power of 0.028 W/cm$^2$ or less.

3. The method of claim 2, wherein, in the generating the plasma of the processing gas, no high frequency bias is supplied to a lower electrode.

4. The method of claim 1, wherein a flow rate ratio, which is represented by a flow rate of the hydrogen gas in the processing gas to a flow rate of the nitrogen gas in the processing gas, is set to be within a range of 1:3 to 9:1.

5. The method of claim 1, further comprising generating plasma of a hydrocarbon gas within the processing container.

* * * * *